United States Patent
Nautiyal et al.

(10) Patent No.: US 9,824,749 B1
(45) Date of Patent: Nov. 21, 2017

(54) READ ASSIST CIRCUITRY

(71) Applicant: ARM Limited, Cambridge (GB)

(72) Inventors: Vivek Nautiyal, Milpitas, CA (US);
Fakhruddin Ali Bohra, Austin, TX (US); Satinderjit Singh, Fremont, CA (US); Shri Sagar Dwivedi, San Jose, CA (US); Abhishek B. Akkur, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/256,200

(22) Filed: Sep. 2, 2016

(51) Int. Cl.
| | |
|---|---|
| *G11C 11/40* | (2006.01) |
| *G11C 11/419* | (2006.01) |
| *G11C 11/418* | (2006.01) |
| G11C 11/409 | (2006.01) |
| G11C 7/06 | (2006.01) |
| G11C 7/10 | (2006.01) |
| G11C 7/12 | (2006.01) |
| G11C 11/413 | (2006.01) |

(52) U.S. Cl.
CPC .......... *G11C 11/419* (2013.01); *G11C 11/418* (2013.01); *G11C 7/06* (2013.01); *G11C 7/1048* (2013.01); *G11C 7/1078* (2013.01); *G11C 7/12* (2013.01); *G11C 11/409* (2013.01); *G11C 11/413* (2013.01)

(58) Field of Classification Search
CPC ....... G11C 7/06; G11C 7/1048; G11C 7/1078; G11C 7/12; G11C 11/409; G11C 11/413; G11C 11/418; G11C 11/419
USPC ...... 365/156, 154, 189.15, 189.16, 203, 204
See application file for complete search history.

(56) References Cited

U.S. PATENT DOCUMENTS

| | | | |
|---|---|---|---|
| 9,142,266 B2 | 9/2015 | Chen et al. | |
| 9,324,392 B1 | 4/2016 | Asenov et al. | |
| 2012/0014172 A1* | 1/2012 | Jung ..................... | G11C 11/413 365/154 |
| 2012/0307574 A1* | 12/2012 | Cheng ................... | G11C 11/419 365/189.14 |
| 2013/0294181 A1* | 11/2013 | Chang ..................... | H01L 21/78 365/189.15 |
| 2014/0071737 A1* | 3/2014 | Sharma ................. | G11C 11/419 365/156 |
| 2015/0332755 A1* | 11/2015 | Singh ....................... | G11C 5/06 365/72 |

OTHER PUBLICATIONS

Chanana, et al.; U.S. Appl. No. 15/188,873 filed Jun. 21, 2016.

* cited by examiner

*Primary Examiner* — Tan T. Nguyen
(74) *Attorney, Agent, or Firm* — Pramudji Law Group PLLC; Ari Pramudji

(57) ABSTRACT

Various implementations described herein are directed to an integrated circuit. The integrated circuit may include precharge circuitry for precharging bitlines to a source voltage level. The integrated circuit may include write assist circuitry having a charge storage element for providing a write assist signal to at least one of the bitlines. The integrated circuit may include read assist circuitry having a switching element for providing charge sharing between the bitlines, the precharge circuitry, and the charge storage element of the write assist circuitry.

20 Claims, 4 Drawing Sheets

READ ASSIST CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional memory cells, such as, e.g., 6T SRAM (static random access memory) cells, a bias of a low internal node may increase during a read operation, due to charge injection from bitline capacitance. In this case, if the bias rises above a switching point of internal inverters, the memory cell may become unstable, and the memory cell may inadvertently switch its state. This particular scenario may be referred to as a read disturb that may occur for an asserted wordline during a read or write operation. In some cases, this read disturb may occur for memory cells on the selected wordline during a read operation. In some other cases, this read disturb may occur for a row of memory cells on a selected wordline during a write operation.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to an area efficient read assist scheme using write assist circuitry, such as, e.g., negative bitline write assist circuitry. For instance, in reference to ultra-low power memories, charge collected during an assist operation may be recirculated for charging a discharged bitline. This read assist scheme may work from the bitline side. For instance, before a read operation, this read assist scheme may share charge with a bitline for pre-charging the bitline to a voltage value of VDD-x, e.g., where x is around ~100 mV. In this case, the reduced bitline voltage may reduce charge injection from the bitline to a cell node, which may improve access disturb margin, i.e., reduce read disturb. Further, when implemented with negative bitline write assist, this read assist scheme may reuse the write assist circuitry. For instance, in some cases, for ultra-low power memories, charge collected during write assist may be reused to bring the bitline to the VDD-x value by recirculating collected charge to the discharged bitline. These features are described in greater detail herein below.

Various implementations of read assist circuitry will be described in detail herein with reference to FIGS. 1-4.

Figure 1:
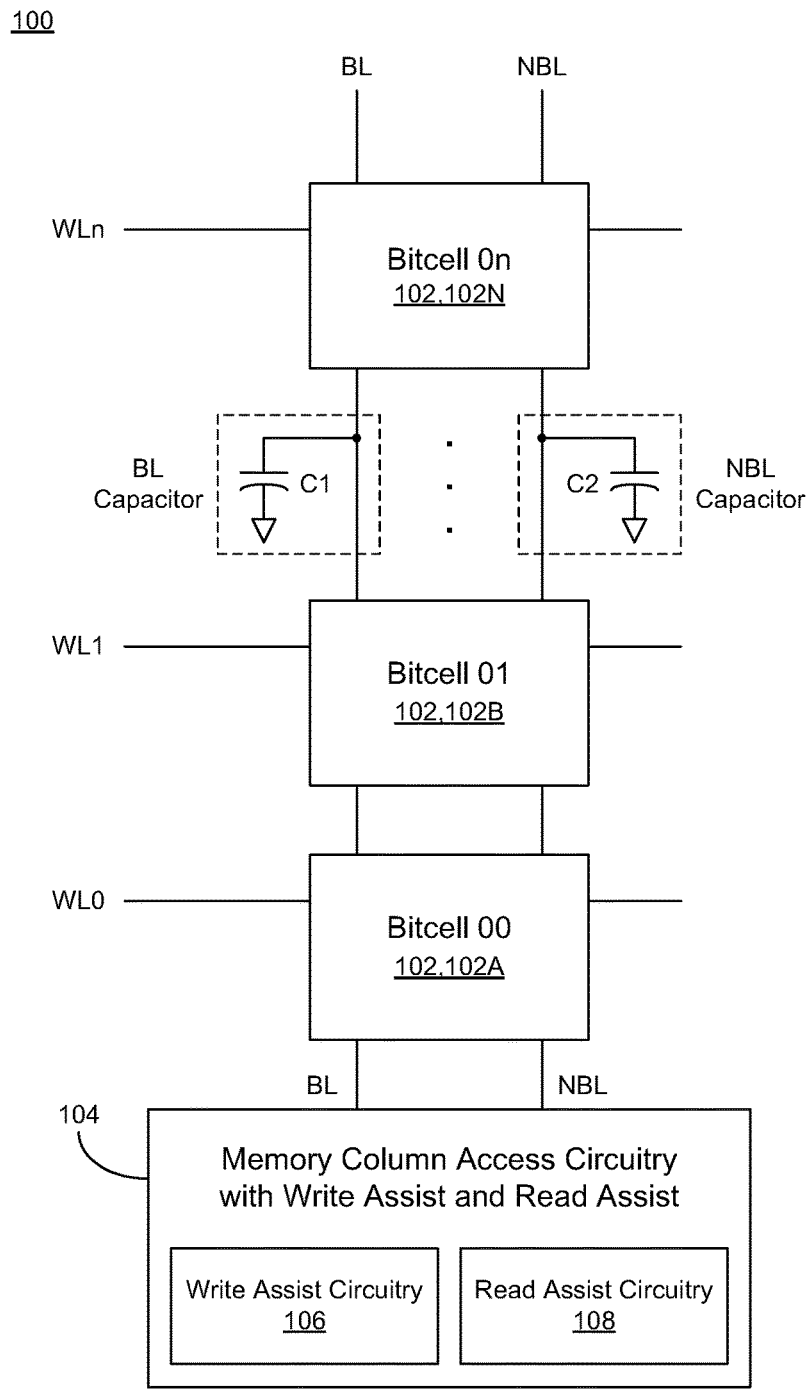
FIG. 1 illustrates a diagram of memory circuitry in accordance with various implementations described herein.

FIG. 1 illustrates a block diagram of memory circuitry 100 in accordance with various implementations described herein.

The memory circuitry 100 may be implemented as an integrated circuit (IC) in utilizing various types of memory, such as, e.g., random access memory (RAM), including static RAM (SRAM), and/or any other types of volatile memory. In some implementations, the memory circuitry 100 may be implemented as an IC with dual rail memory architecture and related circuitry. In some other implementations, the memory circuitry 100 may be integrated with computing circuitry and related components on a single chip. Further, the memory circuitry 100 may be implemented in an embedded system for various electronic and mobile applications, including low power sensor nodes.

As shown in FIG. 1, the memory circuitry 100 may include an array of memory cells 102, wherein each memory cell 102 may be referred to as a bitcell. Further, each memory cell 106 may be configured to store at least one data bit value (e.g., a data value related to a logical '0' or '1'). In various implementations, the array of memory cells 102 may include any number of memory cells or bitcells arranged in various configurations, such as, e.g., a two-dimensional (2D) memory array having columns and rows of multiple memory cells arranged in a 2D grid pattern with 2D indexing capabilities.

In some cases, each memory cell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

The memory circuitry 100 may include memory column access circuitry 104 for accessing each of the memory cells or bitcells 102 via complementary bitlines BL, NBL that are related to wordlines WL0, WL1, . . . , WLn. For instance, during read and write operations, each of the bitcells 102A, 102B, . . . , 102N may be accessed by selecting the bitlines BL, NBL with a bitline signal and a corresponding wordline WL0, WL1, . . . , WLN with a wordline signal. In some implementations, the bitlines BL, NBL may include a first bitline BL and a second bitline NBL that is complementary to the first bitline BL.

The memory column access circuitry 104 may include write assist circuitry 106 and read assist circuitry 108, which is described in greater detail herein below. In some cases, each of the memory cells 102 may be used to store at least one data bit value associated with write data signals received via the bitlines BL, NBL during a write cycle. In this case, the write assist circuitry 106 may be used to provide a write assist signal to at least one of the bitlines during the write cycle. Further, in some cases, each of the data bit values stored in each of the memory cells 102 may be accessible via the bitlines BL, NBL with read data signals during the read cycle. In this case, the read assist circuitry 108 may be used to assist with accessing each of the data bit values stored in each of the memory cells 102 during the read cycle.

In some implementations, as shown in FIG. 1, the memory circuitry 102 may include one or more capacitors coupled to each of the bitlines BL, NBL. For instance, a first capacitor C1 may be coupled to the first bitline BL, and a second capacitor C2 may be coupled to the second or complementary bitline NBL. In some cases, the first capacitor C1 may be referred to as a bitline capacitor for the first bitline BL, and the second capacitor C2 may be referred to as a complementary bitline capacitor for the complementary bitline NBL. In some instances, the second capacitor C2 for the complementary bitline NBL may be referred to as a negative bitline NBL capacitor.

The memory circuitry 102 may operate at a source voltage level VDD with a voltage range that varies with technology. As described herein, before a read operation, charge may be shared with the bitline BL, NBL for pre-charging the bitline BL, NBL to a voltage value of VDD-x, e.g., where x is around ~100 mV. In some cases, as described herein below, the reduced bitline voltage may reduce charge injection from the bitline to a cell node so as to assist with reducing read disturb.

Figure 2:
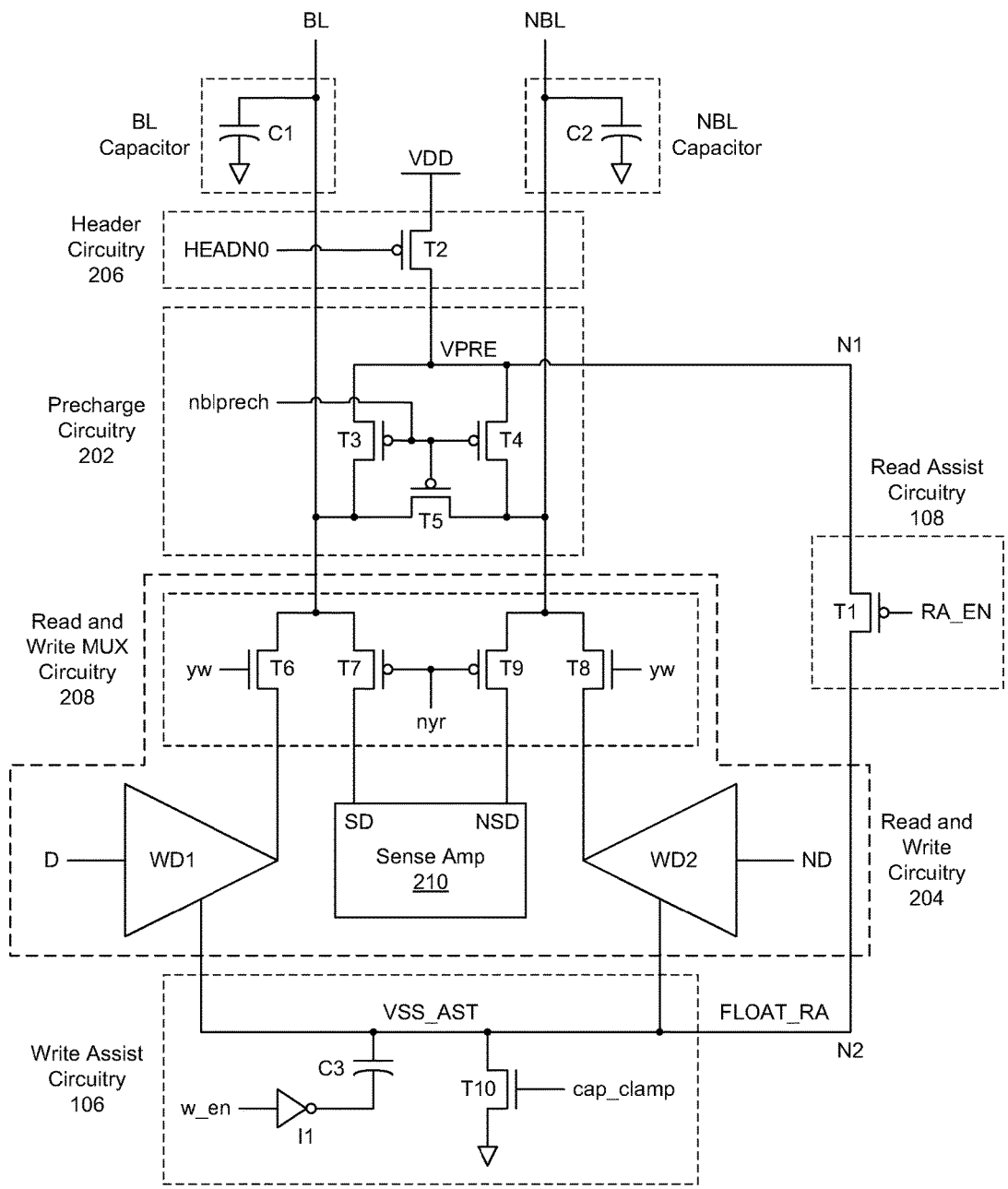
FIG. 2 illustrates a diagram of memory column access circuitry having read and write assist in accordance with various implementations described herein.

FIG. 2 illustrates a diagram 200 of the memory column access circuitry 104 having the write assist circuitry 106 and the read assist circuitry 108 in accordance with various implementations described herein. As with the memory circuitry 100, the memory column access circuitry 104 including the write assist circuitry 106 and the read assist circuitry 108 may be implemented as an integrated circuit (IC).

In some implementations, the memory column access circuitry 104 may include precharge circuitry 202, read and write circuitry 204, header circuitry 206, and read and write MUX circuitry 208, which may be incorporated as part of the read and write circuitry 204. The precharge circuitry 202 may be referred to as bitline precharge and equalize circuitry. As shown in FIG. 2, the read assist circuitry 108 may be coupled between a first node N1 and a second node N2. The precharge circuitry 202 and the header circuitry 206 may be coupled to the read assist circuitry at the first node N1. The read and write circuitry 204 and the write assist circuitry 106 may be coupled to the read assist circuitry 108 at the second node N2. In some cases, as shown in FIG. 2, a precharge voltage VPRE may develop at the first node N1 based on a first source voltage level VDD, and an assist voltage VSS_AST may develop at the second node N2 based on a second source voltage level VSS or GND. The assist voltage VSS_AST may develop as a floating read assist voltage FLOAT_RA when supplied to the read assist circuitry 108. In some cases, as described herein, charge sharing may occur between the first and second nodes N1, N2 based on an activation state of the read assist circuitry 108.

As shown in FIG. 2, the read assist circuitry 108 may include a first switching element, such as, e.g., a first transistor T1, for charge sharing between the precharge circuitry 202, BL and NBL capacitors C1 and C2 to the pre-discharged capacitor C3 of the write assist circuitry 106. The first transistor T1 may provide for charge sharing between at least one of the bitlines BL, NBL and the precharge circuitry 202. Further, the first transistor T1 may be activated with a read assist enable signal RA_EN, and the first transistor T1 may act as a switch between precharge circuitry 202 to the write assist circuitry 106 based on the read assist enable signal RA_EN. In some cases, the first transistor T1 may include a p-type MOS (PMOS) transistor.

The header circuitry 206 may be coupled to the precharge circuitry 202 at the first node N1, and further, the precharge circuitry 202 may be coupled between the header circuitry 206 and the read and write circuitry 204. As shown in FIG. 2, the first transistor T1 may be coupled to the header circuitry 206 and the precharge circuitry 202 at the first node N1, and the first transistor T1 may be coupled to the write assist circuitry 106 at the second node N2 that is different than the first node N1. Further, in some implementations, the header circuitry 206 may include a second or header transistor T2 that is activated with a header enable signal HEADN0. In some scenarios, after the read cycle, activating the first transistor T1 with the read assist enable signal RA_EN, while deactivating the second or header transistor T2 with the header enable signal HEADN0, may provide for charge sharing between the bitlines BL, NBL and the precharge circuitry 202.

The precharge circuitry 202 may be coupled to each of the bitlines BL, NBL for precharging the bitlines BL, NBL to a source voltage level, such as, e.g., VDD, via the header circuitry 206. As described herein, the bitlines BL, NBL may include the first bitline BL and the second bitline NBL that is complementary to the first bitline BL. As shown in FIG. 2, the precharge circuitry 202 may include multiple transistors, including a third transistor T3, a fourth transistor T4, and a fifth transistor T5. As shown in FIG. 2, the third and fourth transistors T3, T4 may be coupled in parallel between the first node N1 and the fifth transistor T5, and further, the fifth transistor T5 may be coupled between the third and fourth transistors T3, T4. Each of the third, fourth, and fifth transistors T3, T4, T5 may include PMOS transistors that are activated based on a negative bitline precharge enable signal nblprech. The precharge voltage VPRE may be developed at the first node N1, and the precharge voltage VPRE may be used to precharge one or more of the bitlines BL, NBL via the third, fourth, and fifth transistors T3, T4, T5.

The write assist circuitry 106 may be coupled to and disposed between the read and write circuitry 204 and the read assist circuitry 108. The write assist circuitry 106 may include a charge storage element, such as, e.g., a third capacitor C3, for providing a write assist signal to at least one of the bitlines BL, NBL. The write assist circuitry 106 may include an inverter or buffer 11 coupled to the third capacitor C3 such that the third capacitor C3 is coupled to and disposed between the read and write circuitry and the inverter 11. The inverter or buffer 11 may be configured to receive a write enable signal w_en. The write assist circuitry 106 may include a clamping transistor T10 that may be configured to receive a capacitor clamp enable signal (cap_clamp). In some cases, the clamping transistor T10 may include an n-type metal-oxide-semiconductor (NMOS) transistor.

The read and write circuitry 204 may include a sense amplifier 210 and a pair of write drivers WD1, WD2 coupled to the bitlines BL, NBL and the precharge circuitry 202 via the read and write MUX circuitry 208. The sense amplifier 210 may sense read data signals SD, NSD on each of the bitlines BL, NBL during a read cycle, and the pair of write drivers WD1, WD2 may provide write data signals D, ND to each of the bitlines BL, NBL during a write cycle. Further, the pair of write drivers WD1, WD2 may include a first write driver WD1 and a second write driver WD2.

As shown in FIG. 2, the read and write MUX circuitry 208 may include a first set of transistors including a sixth transistor T6 and a seventh transistor T7. The sixth transistor T6 may be coupled between an output of the first write driver WD1 and the first bitline BL, and the seventh transistor T7 may be coupled between a first input SD of the sense amplifier 210 and the first bitline BL. Further, as shown, the read and write MUX circuitry 208 may include a second set of transistors including an eighth transistor T8 and a ninth transistor T9. The eighth transistor T8 may be coupled between an output of the second write driver WD2 and the second bitline NBL, and the ninth transistor T9 may be coupled between a second input NSD of the sense amplifier 210 and the second bitline NBL. In some implementations, the sixth and eighth transistors T6, T8 may include NMOS transistors that are activated based on a write select multiplexor (MUX) signal yw, and the seventh and ninth transistors T7, T9 may include PMOS transistors that are activated based on a read select multiplexor (MUX) signal nyr.

The first write driver WD1 may be configured to receive a first data signal D and provide or output a first write data signal to the first bitline BL via the sixth transistor T6 when activated by the write select MUX signal yw. The second write driver WD2 may be configured to receive a second data signal ND and provide or output a second write data signal to the second bitline NBL via the eighth transistor T8 when activated by the write select MUX signal yw. The second data signal ND may be complementary to the first data signal D. Further, the sense amplifier 210 may be configured to receive or sense a first read data signal SD from the first bitline BL via the seventh transistor T7 when activated by the read select MUX signal nyr. The sense amplifier 210 may be configured to receive or sense a second read data signal NSD from the second bitline NBL via the ninth transistor T9 when activated by the read select MUX signal nyr. The second read data signal NSD may be complementary to the first read data signal SD.

Further, as shown in FIG. 2, the third capacitor C3 of the write assist circuitry 106 may be coupled to the second node N2 and further coupled between the pair of write drivers WD1, WD2. In some implementations, the third capacitor C3 may provide a write assist signal to at least one of the bitlines BL, NBL during the write cycle. For instance, the write assist circuitry 106 may be referred to as negative bitline write assist circuitry, and in this instance, the third capacitor C3 may provide the write assist signal to the second bitline NBL (i.e., the complementary bitline NBL) during the write cycle. Thus, the third capacitor C3 may provide the write assist signal to the second bitline NBL to assist with providing the write data signal to the second bitline NBL during the write cycle.

Further, as shown in FIG. 2, the first transistor T1 of the read assist circuitry 108 may be coupled between the precharge circuitry 202 (at the first node N1) and the third capacitor C3 (at the second node N2). In some implementations, the first transistor T1 may be used as a switch to share the charge between precharge circuitry 202, BL and NBL capacitors C1 and C2 to the capacitor C3 in the write assist circuitry 106 during the read cycle. Thus, the first transistor T1 may provide for charge sharing between the bitlines BL, NBL and the precharge circuitry 202. Further, the first transistor T1 may be activated with the read assist enable signal RA_EN when the first transistor T1 is used to capacitively couple the precharge circuitry 202 to the write assist circuitry 106 based on the read assist enable signal RA_EN.

In some implementations, the read assist technique described herein may refer to a bitline precharge lowering through charge sharing. For instance, if negative bitline write assist is used with the read assist technique, then capacitance provided by the third capacitor C3 for read assist may be reused for write assist. As shown and described in reference to FIG. 2, read assist is added by adding the first transistor T1 (e.g., PMOS transistor) for charge sharing between VPRE (at the first node N1) and VSS_AST (at the second node N2). FIG. 2 shows the colmux 104, 200 with the read assist 108 combined with the write assist 106 (e.g., negative bitline write assist).

Figure 3:
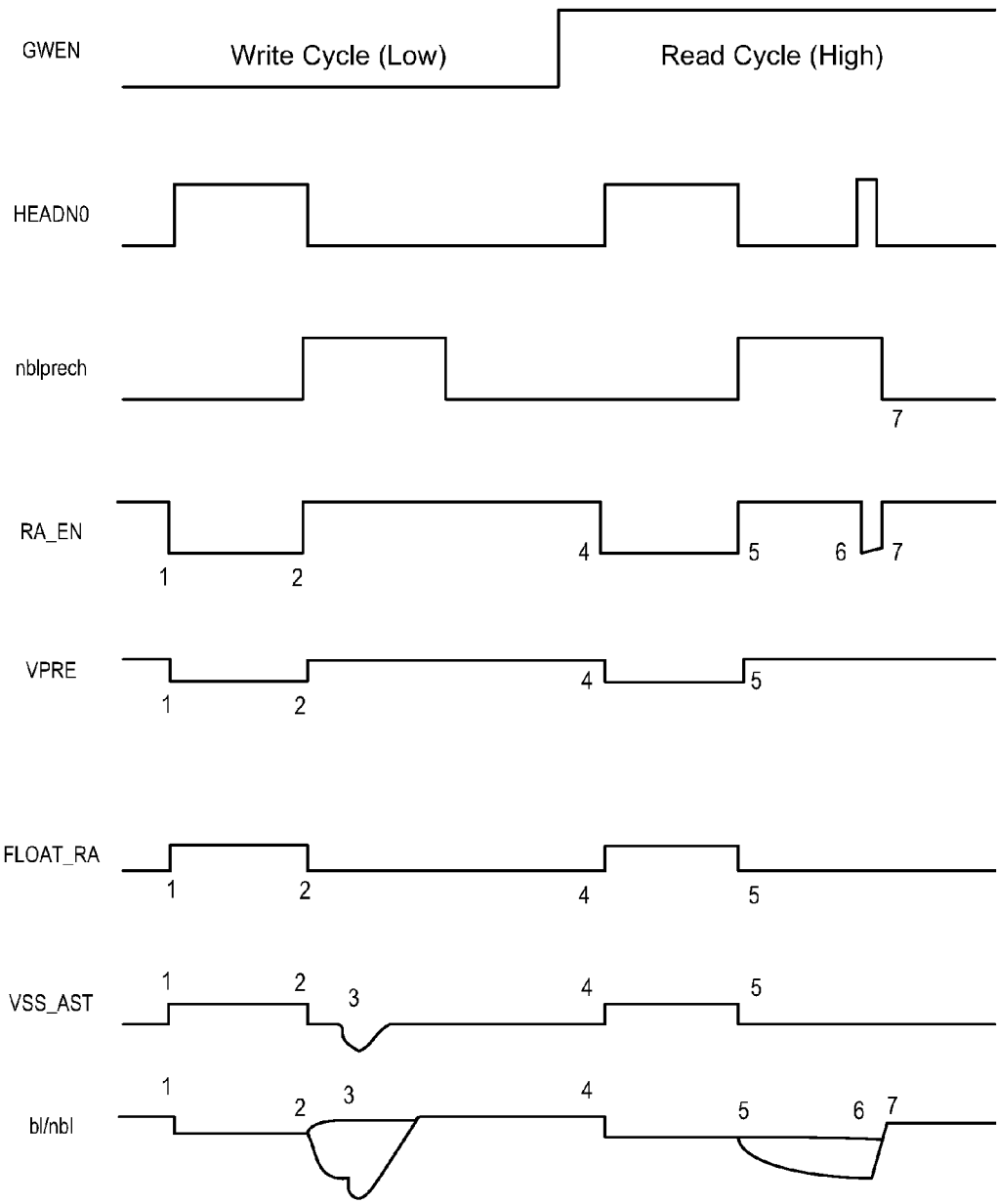
FIG. 3 illustrates various signal timing diagrams in accordance with various implementations described herein.

FIG. 3 illustrates various signal timing diagrams 300 for read and write cycles when read assist is used along with negative bitline write assist in accordance with various implementations described herein.

As shown in FIG. 3, a global write enable signal (GWEN) depicts a waveform having a write cycle (during a low voltage cycle) and a read cycle (during a high voltage cycle). During the write and read cycles, the header enable signal (HEADN0), negative bitline precharge signal (nblprech), and write assist enable signal (RA_EN) are provided as shown in FIG. 3. Based on these signals, the remaining signal timing diagrams shown in FIG. 3 refer to falling and rising changes 1-7 as described herein below.

At (1), VPRE, BL, and NBL voltage may be lowered through charge sharing at start of the write cycle for read disturb in half selected bitcells, which are depicted in the bl/nbl waveform of FIG. 3.

At (2), during a write operation, the write drivers WD1, WD2 may be configured to bring the bitline bl/nbl to ground level (VSS or GND), and VSS_AST may be brought back to VSS level through the cap_clamp controlled NMOS transistor T10 (FIG. 2).

At (3), the negative bitline write assist may be configured to bring VSS_AST to a negative voltage level.

At (4), during a read cycle, VPRE, BL, and NBL voltage may be lowered though charge sharing at the start of a read operation.

At (5), a read operation may discharge at least one of the bitlines bl/nbl.

At (6), optional for low power SRAMs, such as, e.g., for Internet of Things (IOT) applications, the discharged bitline bl/nbl may be precharged to the VPRE level through charge recycling.

At (7), charge recycling may be stopped or halted, and the bitlines bl/nbl may be precharged through activating (i.e., turning ON) the precharge circuitry 202 (i.e., bitline precharge and equalize circuitry) (FIG. 2).

Thus, in reference to (6) and (7), for low voltage ultra-low power SRAM for IOT applications, charge shared from VPRE and the bitlines BL, NBL to FLOAT_RA may be recycled to recharge the discharged bitline, such as, e.g., NBL. After the read operation, the sense amplifier output may be used to couple the FLOAT_RA node (i.e., the second node N2) to the discharged bitline (e.g., NBL) and recharge that bitline (e.g., NBL) by (or with) charge stored in the FLOAT_RA node. Alternatively, activating or turning ON the PMOS (i.e., first transistor T1) controlled by RA_EN while keeping HEADN0 OFF (i.e., header transistor T2) may share charge between the dropped bitline, the undropped bitline, and VPRE. This sharing of charge may result in a reduced demand of charge from the voltage supply level VDD, and hence, this refers to low power. Further, in some cases, to reduce capacitor area for read assist only implementation, coupling may be used along with sharing to bring the FLOAT_RA node (i.e., Node N2) to negative level at the time of charge sharing with VPRE and the bitlines BL, NBL.

Figure 4:
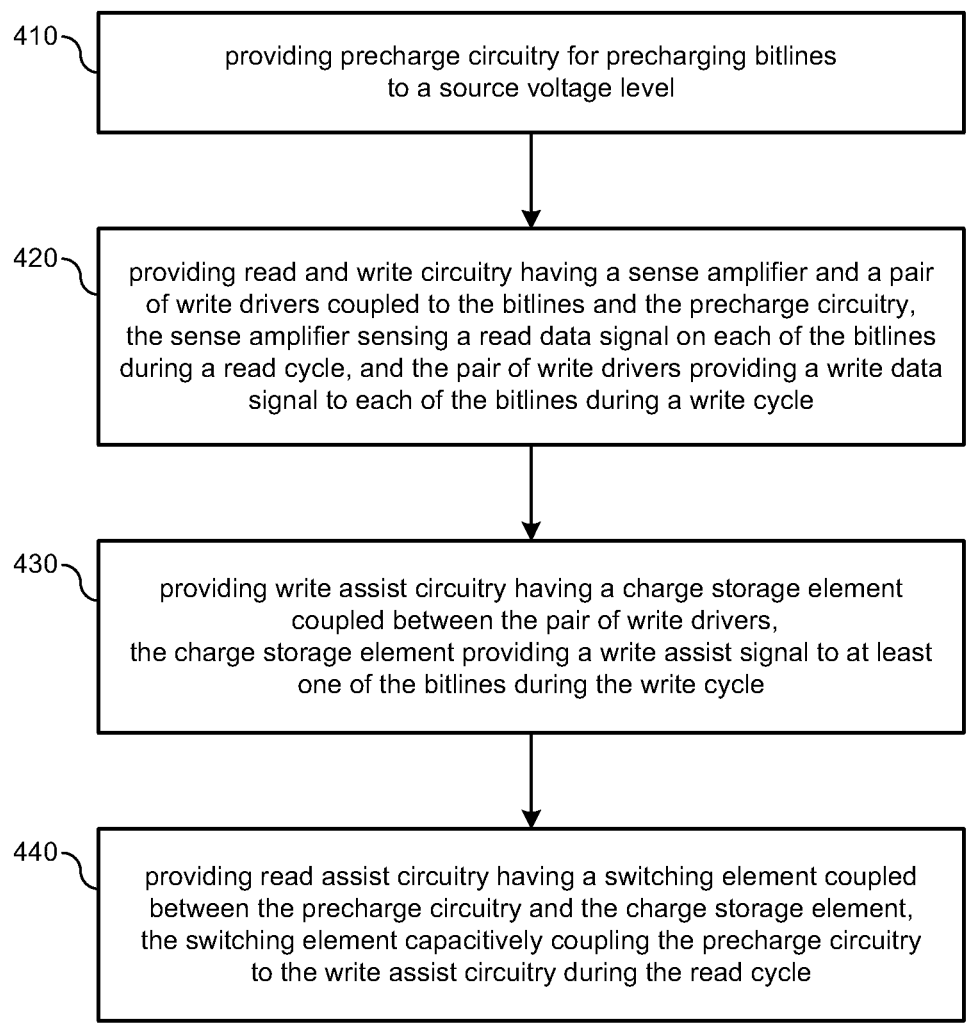
FIG. 4 illustrates a process flow of a method of fabricating read assist circuitry in accordance with various implementations described herein.

FIG. 4 illustrates an example process flow of a method 400 of fabricating read assist circuitry in accordance with various implementations described herein.

It should be understood that even though method 400 may indicate a particular order of operation execution, in some cases, various certain portions of the operations may be executed in a different order, and on different systems. In some other cases, additional operations and/or steps may be added to and/or omitted from method 400. Further, method 400 may be implemented in hardware and/or software. If implemented in hardware, the method 400 may be implemented with various circuit components, such as described herein above in reference to FIGS. 1-3. If implemented in software, the method 400 may be implemented as a program or software instruction process that may be configured for fabricating or designing read assist circuitry for memory applications as described herein. Further, if implemented in software, instructions related to implementing the method 400 may be stored in memory and/or a database. For instance, a computer or various other types of computing devices having a processor and memory may be configured to perform method 400.

In reference to FIG. 4, method 400 may be utilized for fabricating or designing integrated circuitry or an integrated circuit having read assist circuitry for memory applications. In some implementations, at block 410, method 400 may provide precharge circuitry for precharging bitlines to a source voltage level.

At block 420, method 400 may provide read and write circuitry having a sense amplifier and a pair of write drivers coupled to the bitlines and the precharge circuitry. The sense amplifier may sense a read data signal on each of the bitlines during a read cycle, and the pair of write drivers may provide a write data signal to each of the bitlines during a write cycle.

At block 430, method 400 may provide write assist circuitry having a charge storage element coupled between the pair of write drivers. The charge storage element may provide a write assist signal to at least one of the bitlines during the write cycle. In some implementations, the charge storage element may be a capacitor.

At block 440, method 400 may provide read assist circuitry having a switching element coupled between the precharge circuitry and the charge storage element. The switching element may capacitively couple the precharge circuitry to the write assist circuitry during the read cycle. The switching element may provide for charge sharing between the bitlines and the precharge circuitry. In some implementations, the switching element may be a transistor.

In some implementations, the method 400 may include providing a memory cell coupled to the bitlines. The memory cell may be used to store at least one data bit value associated with the write data signals received via the bitlines during the write cycle, and the at least one data bit value may be accessible via the bitlines with the read data signals during the read cycle.

Described herein are various implementations of an integrated circuit. The integrated circuit may include precharge circuitry for precharging bitlines to a source voltage level. The integrated circuit may include write assist circuitry having a charge storage element for providing a write assist signal to at least one of the bitlines. The integrated circuit may include read assist circuitry having a switching element for providing charge sharing between the bitlines, the precharge circuitry, and the charge storage element of the write assist circuitry.

Described herein are various implementations of an integrated circuit. The integrated circuit may include precharge circuitry for precharging bitlines to a source voltage level. The integrated circuit may include read and write circuitry having a sense amplifier and a pair of write drivers coupled to the bitlines and the precharge circuitry. The sense amplifier may sense a read data signal on each of the bitlines during a read cycle, and the pair of write drivers may provide a write data signal to each of the bitlines during a write cycle. The integrated circuit may include write assist circuitry having a charge storage element coupled between the pair of write drivers. The charge storage element may provide a write assist signal to at least one of the bitlines during the write cycle. The integrated circuit may include read assist circuitry having a switching element coupled between the precharge circuitry and the charge storage element. The switching element may provide for charge sharing between the bitlines, the precharge circuitry, and the charge storage element of the write assist circuitry during the read cycle.

Described herein are various implementations of a method of fabricating an integrated circuit. The method may include providing precharge circuitry for precharging bitlines to a source voltage level. The method may include providing read and write circuitry having a sense amplifier and a pair of write drivers coupled to the bitlines and the precharge circuitry. The sense amplifier may sense a read data signal on each of the bitlines during a read cycle, and the pair of write drivers may provide a write data signal to each of the bitlines during a write cycle. The method may include providing write assist circuitry having a charge storage element coupled between the pair of write drivers. The charge storage element may provide a write assist signal to at least one of the bitlines during the write cycle. The method may include providing read assist circuitry having a switching element coupled between the precharge circuitry and the charge storage element. The switching element may provide charge sharing between the bitlines, the precharge circuitry, and the charge storage element of the write assist circuitry during the read cycle.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    precharge circuitry for precharging bitlines to a source voltage level;
    write assist circuitry having a charge storage element for providing a write assist signal to at least one of the bitlines; and
    read assist circuitry having a switching element for providing charge sharing between the bitlines, the precharge circuitry, and the charge storage element of the write assist circuitry.

2. The integrated circuit of claim 1, further comprising:
    a memory cell coupled to the bitlines, wherein the memory cell stores at least one data bit value that is accessible via the bitlines.

3. The integrated circuit of claim 1, wherein each of the bitlines comprise a capacitor coupled thereto, and wherein the switching element provides for charge sharing between each of the capacitors of the bitlines, the precharge circuitry, and the charge storage element of the write assist circuitry.

4. The integrated circuit of claim 1, wherein the switching element is activated with a read assist enable signal, and wherein the switching element provides for charge sharing between the bitlines, the precharge circuitry, and the write assist circuitry based on the read assist enable signal.

5. The integrated circuit of claim 1, wherein the charge storage element comprises a capacitor, and wherein the switching element comprises a transistor.

6. The integrated circuit of claim 1, further comprising:
    read and write circuitry having a sense amplifier and a pair of write drivers coupled to the bitlines and the precharge circuitry, the sense amplifier sensing a read data signal on each of the bitlines during a read cycle, the pair of write drivers providing a write data signal to each of the bitlines during a write cycle,
    wherein the charge storage element of the write assist circuitry is coupled between the pair of write drivers, and
    wherein the switching element of the read assist circuitry is coupled between the precharge circuitry and the charge storage element.

7. An integrated circuit, comprising:
    precharge circuitry for precharging bitlines to a source voltage level;
    read and write circuitry having a sense amplifier and a pair of write drivers coupled to the bitlines and the precharge circuitry, the sense amplifier sensing a read data signal on each of the bitlines during a read cycle, the pair of write drivers providing a write data signal to each of the bitlines during a write cycle;
    write assist circuitry having a charge storage element coupled between the pair of write drivers, the charge storage element providing a write assist signal to at least one of the bitlines during the write cycle; and
    read assist circuitry having a switching element coupled between the precharge circuitry and the charge storage element, the switching element providing for charge sharing between the bitlines, the precharge circuitry, and the charge storage element of the write assist circuitry during the read cycle.

8. The integrated circuit of claim 7, further comprising:
    a memory cell coupled to the bitlines,
    wherein the memory cell stores at least one data bit value associated with the write data signals received via the bitlines during the write cycle, and
    wherein the at least one data bit value is accessible via the bitlines with the read data signals during the read cycle.

9. The integrated circuit of claim 7, wherein the bitlines include a first bitline and a second bitline that is complementary to the first bitline, and wherein the at least one of the bitlines comprises the second bitline.

10. The integrated circuit of claim 9, wherein the charge storage element provides the write assist signal to the second bitline to assist with providing the write data signal to the second bitline during the write cycle.

11. The integrated circuit of claim 7, wherein the charge storage element comprises a capacitor.

12. The integrated circuit of claim 7, wherein each of the bitlines comprise a capacitor coupled thereto, and wherein the switching element provides for charge sharing between each of the capacitors of the bitlines, the precharge circuitry, and the charge storage element of the write assist circuitry.

13. The integrated circuit of claim 7, wherein the switching element is activated with a read assist enable signal, and wherein the switching element providing for charge sharing between the bitlines, the precharge circuitry, and the write assist circuitry based on the read assist enable signal.

14. The integrated circuit of claim 7, further comprising header circuitry coupled to the precharge circuitry at a first node, wherein the precharge circuitry is coupled between the header circuitry and the read and write circuitry.

15. The integrated circuit of claim 14, wherein the switching element is coupled to the header circuitry and the precharge circuitry at the first node, and wherein the switching element is coupled to the write assist circuitry at a second node that is different than the first node.

16. The integrated circuit of claim 14, wherein the header circuitry comprises a header transistor that is activated with a header enable signal, and wherein after the read cycle, activating the switching element with the read assist enable signal while deactivating the header transistor with the header enable signal provides for charge sharing between the bitlines and the precharge circuitry.

17. The integrated circuit of claim 7, wherein the switching element comprises a transistor.

18. A method of fabricating an integrated circuit, the method comprising:
providing precharge circuitry for precharging bitlines to a source voltage level;
providing read and write circuitry having a sense amplifier and a pair of write drivers coupled to the bitlines and the precharge circuitry, the sense amplifier sensing a read data signal on each of the bitlines during a read cycle, and the pair of write drivers providing a write data signal to each of the bitlines during a write cycle,
providing write assist circuitry having a charge storage element coupled between the pair of write drivers, the charge storage element providing a write assist signal to at least one of the bitlines during the write cycle; and
providing read assist circuitry having a switching element coupled between the precharge circuitry and the charge storage element, the switching element providing charge sharing between the bitlines, the precharge circuitry, and the charge storage element of the write assist circuitry during the read cycle.

19. The method of claim 18, further comprising:
providing a memory cell coupled to the bitlines,
wherein the memory cell stores at least one data bit value associated with the write data signals received via the bitlines during the write cycle, and
wherein the at least one data bit value is accessible via the bitlines with the read data signals during the read cycle.

20. The method of claim 18, wherein:
the charge storage element comprises a capacitor,
the switching element comprises a transistor, and
the transistor provides for charge sharing between the bitlines and the precharge circuitry.

* * * * *